United States Patent
Jung et al.

(10) Patent No.: US 11,538,432 B2
(45) Date of Patent: Dec. 27, 2022

(54) OUTPUT BUFFER INCREASING SLEW RATE OF OUTPUT SIGNAL VOLTAGE WITHOUT INCREASING CURRENT CONSUMPTION

(71) Applicant: DB HiTek Co., Ltd., Seoul (KR)

(72) Inventors: Hak Jin Jung, Incheon (KR); Eun Ji Youn, Bucheon-si (KR); Pyung Sik Ma, Seoul (KR)

(73) Assignee: DB HiTek, Co., Ltd., Seoul (KR)

( * ) Notice: Subject to any disclaimer, the term of this patent is extended or adjusted under 35 U.S.C. 154(b) by 0 days.

(21) Appl. No.: 17/552,004

(22) Filed: Dec. 15, 2021

(65) Prior Publication Data
US 2022/0238081 A1 Jul. 28, 2022

(30) Foreign Application Priority Data
Jan. 27, 2021 (KR) .................. 10-2021-0011534

(51) Int. Cl.
*G09G 3/36* (2006.01)
*H03K 3/356* (2006.01)

(52) U.S. Cl.
CPC ..... *G09G 3/3688* (2013.01); *H03K 3/356113* (2013.01); *G09G 2310/0289* (2013.01); *G09G 2310/0291* (2013.01); *G09G 2330/02* (2013.01)

(58) Field of Classification Search
CPC ...... G09G 3/36; G09G 3/3611; G09G 3/3648; G09G 3/3674; G09G 3/3677; G09G 3/3681; G09G 3/3685; G09G 3/3688; G09G 3/3692; G09G 2310/0291

USPC .................................................. 345/87–104
See application file for complete search history.

(56) References Cited

U.S. PATENT DOCUMENTS

| | | | | |
|---|---|---|---|---|
| 7,362,173 B1* | 4/2008 | Knausz | ................. | H03F 3/4521 330/253 |
| 8,217,721 B1* | 7/2012 | Hsieh | .................. | H03F 3/45219 330/257 |
| 2005/0110738 A1* | 5/2005 | Kim | ..................... | G09G 3/3688 345/100 |
| 2006/0091955 A1* | 5/2006 | Choi | ..................... | H03F 3/3022 330/292 |
| 2006/0181350 A1* | 8/2006 | Jones | .................. | H03F 3/45094 330/255 |
| 2011/0199366 A1* | 8/2011 | Tsuchi | ................. | G09G 3/3688 345/212 |
| 2013/0194251 A1* | 8/2013 | Cheng | ................. | G09G 3/3688 345/92 |
| 2015/0084694 A1* | 3/2015 | Lee | ......................... | H03F 1/483 327/170 |

(Continued)

*Primary Examiner* — Alexander Eisen
*Assistant Examiner* — Nelson Lam
(74) *Attorney, Agent, or Firm* — Andrew D. Fortney; Central California IP Group, P.C.

(57) ABSTRACT

An input stage configured to differentially amplify an input signal and an output signal, a first current mirror and a second current mirror configured to receive a differential current from the input stage, an output stage including first and second output transistors, respectively including a gate connected to the first and second current mirrors, and a slew rate compensation circuit configured to (i) mirror a comparison current generated by comparing a voltage of a first input signal with a voltage of a second input signal, and (ii) provide the mirrored comparison current to the gate of the first or second output transistor.

20 Claims, 12 Drawing Sheets

(56) References Cited

U.S. PATENT DOCUMENTS

2022/0109415 A1\* 4/2022 Moon ................ H03F 3/45273

\* cited by examiner

OUTPUT BUFFER INCREASING SLEW RATE OF OUTPUT SIGNAL VOLTAGE WITHOUT INCREASING CURRENT CONSUMPTION

This application claims the benefit of Korean Patent Application No. 10-2021-0011534, filed on Jan. 27, 2021, incorporated herein by reference as if fully set forth herein.

BACKGROUND OF THE INVENTION

Field of the Invention

Embodiments of the present disclosure relate to an output buffer and a source driver including the same.

Discussion of the Related Art

A liquid crystal display (LCD) device generally includes pixels in the form of a matrix having rows and columns. Each pixel may include a thin-film transistor and a pixel electrode on a substrate. The gates of the thin-film transistors in the same row may be connected to one another by a gate line and controlled by a gate driver.

In addition, the sources of the thin-film transistors in the same column may be connected to one another by a data line and controlled by a source driver, for example, a display driver IC (DDI).

As demands for low-power, high-resolution display devices have increased rapidly, demand for a DDI having a high slew rate and an ability to charge a display panel in a short time is felt.

SUMMARY OF THE INVENTION

Accordingly, the present invention is directed to an output buffer and a source driver including the same that substantially obviate one or more problems due to limitations and disadvantages of the related art.

An object of embodiments of the present disclosure is to provide an output buffer that may increase the slew rate of an output signal voltage without increasing current consumption, and a source driver including the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, an output buffer includes an input stage including a first amplifier generating first and second currents by differentially amplifying a first input signal and a second input signal, and a second amplifier generating third and fourth currents by differentially amplifying the first input signal and the second input signal, a first current mirror including first and second transistors connected in series at a first node configured to receive or provide the first current and connected between a first power source and a second node, and third and fourth transistors connected in series at a third node configured to receive or provide the second current and connected between the first power source and a fourth node, a second current mirror including fifth and sixth transistors connected in series at a fifth node configured to receive or provide the third current and connected between a second power source and a sixth node, and seventh and eighth transistors connected in series at a seventh node configured to receive or provide the fourth current and connected between the first power source and an eighth node, an output stage including a first output transistor including a gate connected to the fourth node and connected between the first power source and an output node, and a second output transistor including a gate connected to the eighth node and connected between the second power source and the output node, and a slew rate compensation circuit configured to mirror a comparison current generated by comparing a voltage of the first input signal with a voltage of the second input signal, and provide a mirrored comparison current to at least one of the fourth node or the eighth node.

The output buffer may further include a first capacitor connected between the third node and the output node, and a second capacitor connected between the seventh node and the output node.

The slew rate compensation circuit may be configured to generate a first comparison current between the first power source and the output node, and provide a mirroring current resulting from mirroring the first comparison current to the eighth node.

Alternatively, the slew rate compensation circuit may be configured to generate a first comparison current between the first power source and the output node, and provide a mirroring current resulting from mirroring the first comparison current to the fourth node.

Alternatively, the slew rate compensation circuit may be configured to generate a second comparison current between the output node and the second power source, and provide a mirroring current resulting from mirroring the second comparison current to the fourth node.

Alternatively, the slew rate compensation circuit may be configured to generate a second comparison current between the output node and the second power source, and provide a mirroring current resulting from mirroring the second comparison current to the eighth node.

A first voltage of the first power source may be greater than a second voltage of the second power source.

Alternatively, the slew rate compensation circuit may be configured to generate a first comparison current between the first power source and the output node, generate a first mirroring current and a second mirroring current resulting from mirroring the first comparison current, provide the first mirroring current to the fourth node, and provide the second mirroring current to the eighth node. The slew rate compensation circuit may be configured to generate a second comparison current between the output node and the second power source, generate a third mirroring current and a fourth mirroring current resulting from mirroring the second comparison current, provide the third mirroring current to the fourth node, and provide the fourth mirroring current to the eighth node.

Alternatively, the slew rate compensation circuit may be configured to generate a first comparison current between the first power source and the output node, generate a first mirroring current and a second mirroring current resulting from mirroring the first comparison current, provide the first mirroring current to the eighth node, and provide the second mirroring current to the seventh node. The slew rate compensation circuit may be configured to generate a second comparison current between the output node and the second power source, generate a third mirroring current and a fourth mirroring current resulting from mirroring the second comparison current, provide the third mirroring current to the fourth node, and provide the fourth mirroring current to the third node.

Alternatively, the slew rate compensation circuit may be configured to generate a first comparison current between the first power source and the output node, generate a first mirroring current and a second mirroring current resulting from mirroring the first comparison current, provide the first mirroring current to the fourth node, and provide the second mirroring current to the seventh node. The slew rate compensation circuit may be configured to generate a second comparison current between the output node and the second power source, generate a third mirroring current and a fourth mirroring current resulting from mirroring the second comparison current, provide the third mirroring current to the eighth node, and provide the fourth mirroring current to the third node.

The slew rate compensation circuit may be configured to generate a first comparison current between the first power source and the output node, generate a first mirroring current, a second mirroring current, and a third mirroring current resulting from mirroring the first comparison current, provide the first mirroring current to the eighth node, provide the second mirroring current to the fourth node, and provide the third mirroring current to the seventh node. The slew rate compensation circuit may be configured to generate a second comparison current between the output node and the second power source, generate a fourth mirroring current, a fifth mirroring current, and a sixth mirroring current resulting from mirroring the second comparison current, provide the fourth mirroring current to the fourth node, provide the fifth mirroring current to the eighth node, and provide the sixth mirroring current to the third node.

The output buffer may further include a first transmission gate connected between the second node and the fifth node and controlled by a first control voltage, and a second transmission gate connected between the fourth node and the seventh node and controlled by a second control voltage.

The first input signal may comprise a voltage fed back from the output node.

The slew rate compensation circuit may include a comparator configured to generate a first comparison current between the first power source and the output node or a second comparison current between the output node and the second power source, from a comparison of the voltage of the first input signal with the voltage of the second input signal, a third current mirror configured to mirror the first comparison current and generate the first mirrored comparison current, and a fourth current mirror configured to mirror the second comparison current and generate a second mirrored comparison current.

According to another embodiment, an output buffer includes an input stage configured to differentially amplify an input signal and an output signal, a first current mirror and a second current mirror configured to receive a differential current from the input stage, an output stage including a first output transistor including a gate connected to the first current mirror, and a second output transistor including a gate connected to the second current mirror, and a slew rate compensation circuit configured to mirror a comparison current generated by comparing a voltage of the first input signal with a voltage of the second input signal, and provide the mirrored comparison current to the gate of the first output transistor or the gate of the second output transistor.

According to an embodiment, a source driver includes a latch configured to store data, a level shifter configured to convert a voltage level of the data from the latch, a digital-to-analog converter configured to convert an output of the level shifter to an analog signal, and an output buffer configured to amplify the analog signal and output the amplified analog signal. The output buffer may include the output buffer according to the embodiments.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
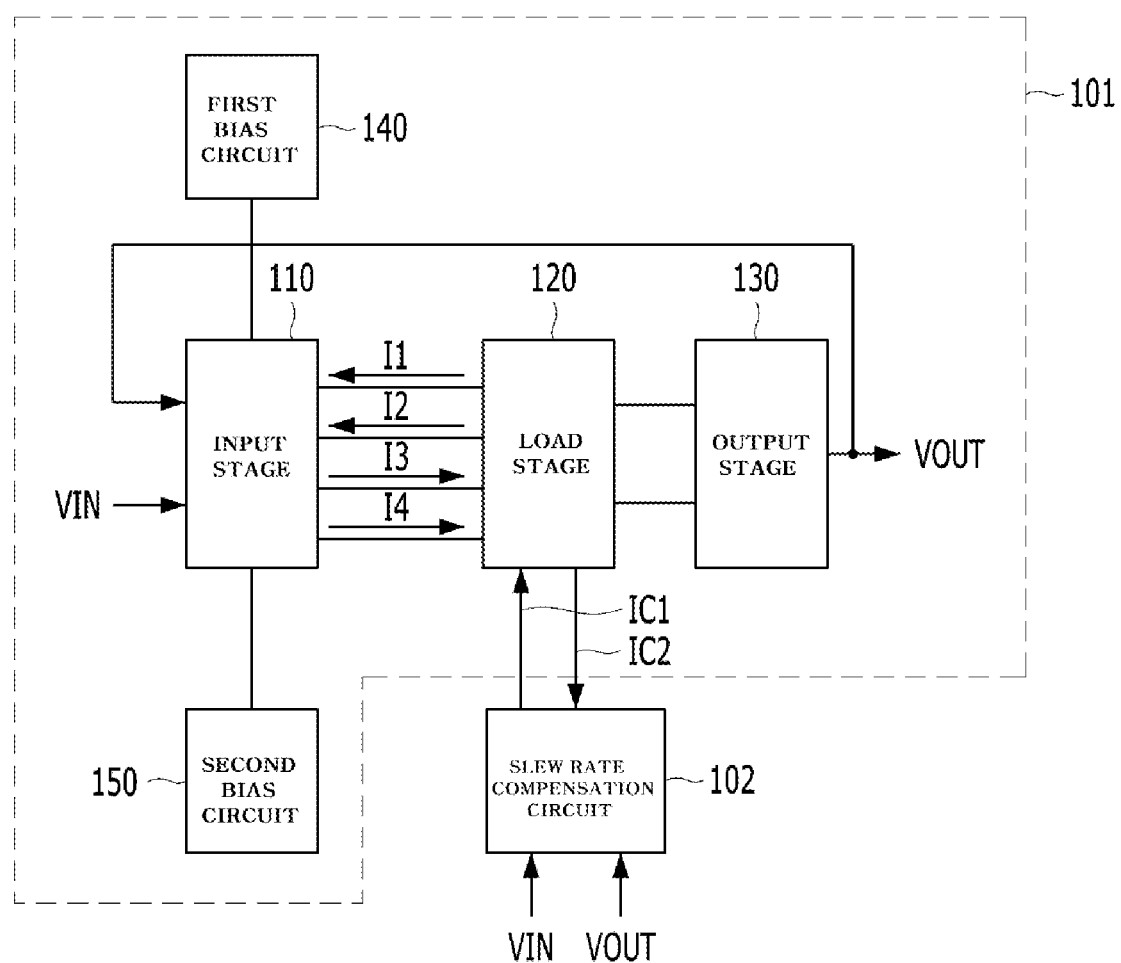
FIG. 1 is a diagram illustrating the configuration of an output buffer according to one or more embodiments of the disclosure.

Reference will now be made in detail to embodiments of the present invention, examples of which are illustrated in the accompanying drawings.

In the following description of various embodiments, it will be understood that, when an element is referred to as being "on" or "under" another element, it can be directly on or under the other element, or one or more intervening elements may be present between the elements. Furthermore, when the expression "on" or "under" is used herein, it may involve not only the upward direction, but also the downward direction, with reference to the element.

In addition, it will be understood that relative terms used hereinafter such as "first", "second", "on"/"above"/"over"

and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

In addition, the term "include", "comprise", or "have" should be interpreted as including the listed or described components, without excluding other components. In addition, the term "corresponding" may mean at least one of "facing" or "overlapping".

Figure 2:
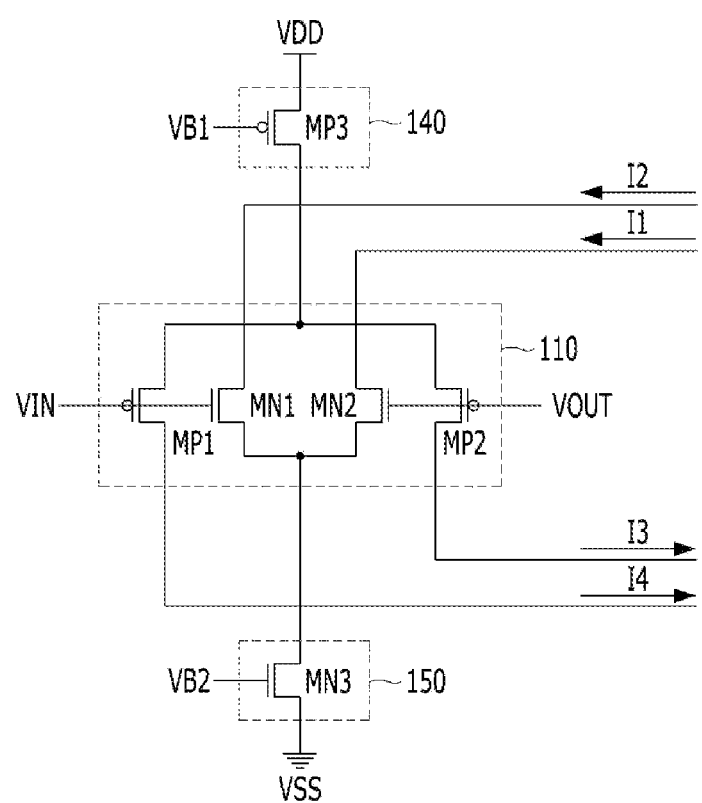
FIG. 2 is a circuit diagram illustrating an exemplary input stage useful for the output buffer illustrated in FIG. 1 according to an embodiment.
Figure 3:
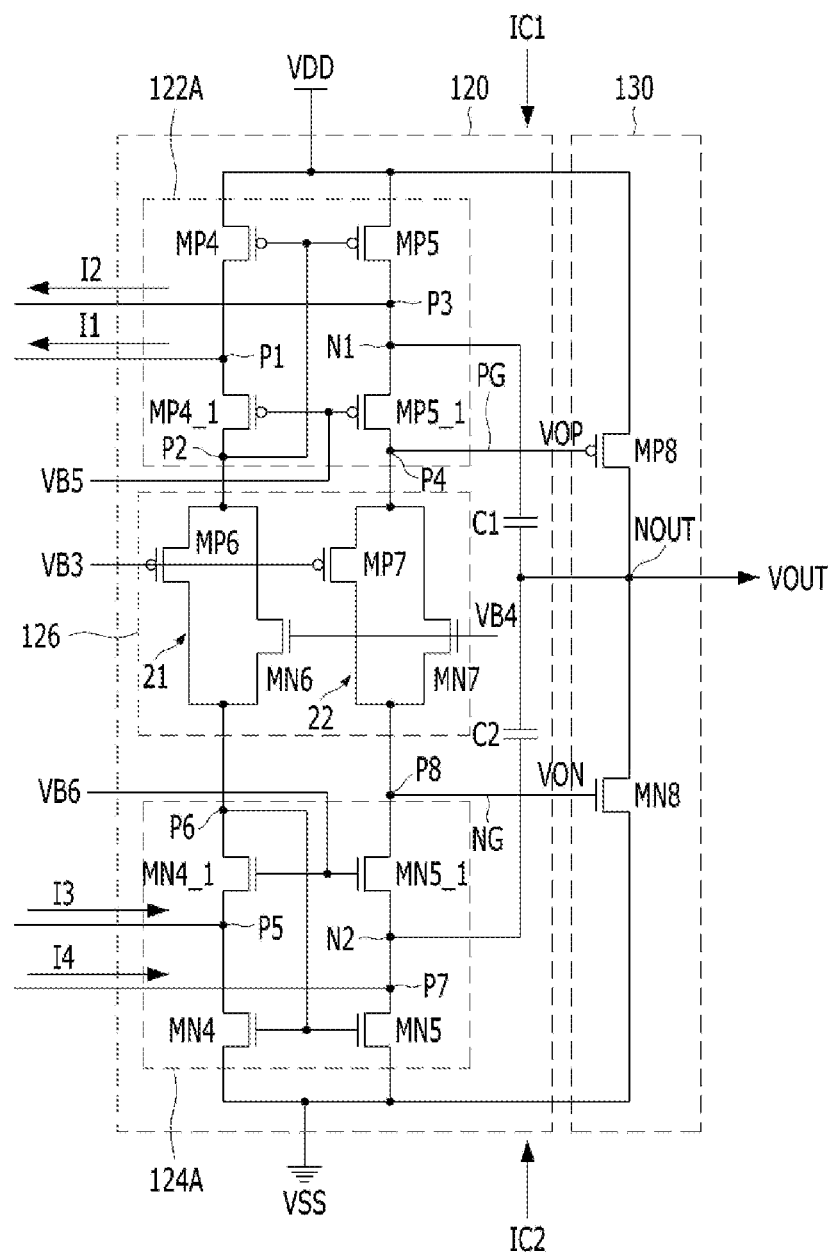
FIG. 3 is a circuit diagram illustrating an exemplary load stage and an exemplary output stage useful for the output buffer illustrated in FIG. 1 according to an embodiment.
Figure 4:
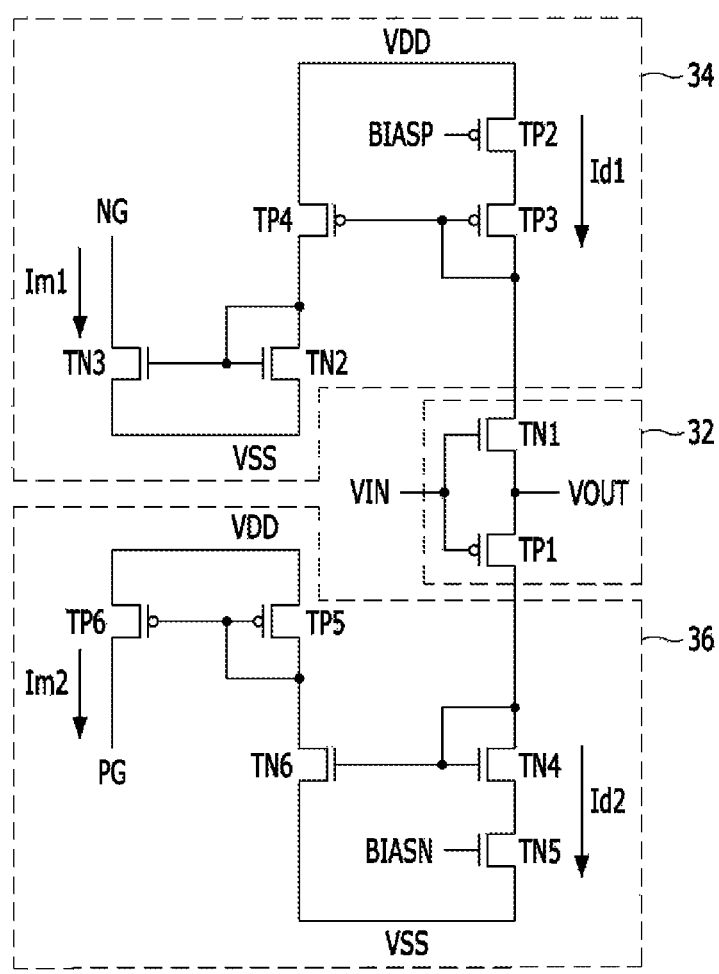
FIG. 4 is a diagram illustrating an embodiment of a slew rate compensation circuit useful for the output buffer illustrated in FIG. 1.

FIG. 1 illustrates an output buffer 100 according to one or more embodiments of the disclosure, FIG. 2 is a circuit diagram illustrating an input stage 110 useful for the output buffer 100 illustrated in FIG. 1, FIG. 3 is a circuit diagram illustrating a load stage 120 and an output stage 130 useful for the output buffer 100 illustrated in FIG. 1, and FIG. 4 is an embodiment of a slew rate compensation circuit 102 useful for the output buffer 100 illustrated in FIG. 1.

The output buffer 100 may include the amplifier 101 and the slew rate compensation circuit 102. The term "output buffer" may be interchangeably used with the terms "buffer circuit", "output circuit", or "output amplification circuit".

A display driver integrated circuit (IC) of a liquid crystal display (LCD) device may include one or more output buffers 100. The output buffer 100 may generate an output voltage (e.g., VOUT) that drives a channel of a display panel. For example, the channel may refer to a data line connected to one or more pixels of the display panel.

The amplifier 101 amplifies or buffers an input signal VIN and generates an output signal VOUT.

The amplifier 101 may include an input stage 110, a load stage 120, and an output stage 130. The input stage 110 and the load stage 120 may be collectively referred to as a "first output stage", and the output stage 130 may be referred to as a "second output stage".

The amplifier 101 may further include a first bias circuit 140 and a second bias circuit 150.

The input stage 110 receives the input signal VIN and the output signal VOUT and determines the difference between the received input signal VIN and output signal VOUT. For example, the input stage 110 may generate first to fourth currents I1 to I4 by differential amplification of the input signal VIN and the output signal VOUT.

The load stage 120 is connected to the input stage 110, receives the currents I1, I2, I3, and I4 from the input stage 110, and performs a slew rate compensation operation on the output signal VOUT using compensation currents IC1 and IC2.

The slew rate compensation circuit 102 generates the compensation currents IC1 and IC2 based on the difference between the input signal VIN and the output signal VOUT, and provides the compensation currents IC1 and IC2 to the load stage 120. Relative to an otherwise identical output buffer without the slew rate compensation circuit 102, the slew rate compensation circuit 102 increases the slew rate of the output signal VOUT, thereby reducing the transition time of the output signal VOUT.

Referring to FIG. 2, the input stage 110 may include an amplifier (for example, a differential amplifier). For example, the input stage 110 may include a first amplifier that differentially amplifies the input signal VIN and the output signal VOUT, and generates the first and second currents I1 and I2 by the differential amplification. The input stage 110 may also include a second amplifier that generates third and fourth currents I3 and I4 by differential amplification. A first through fourth currents disclosed herein may each also be referred to as a "load current".

For example, the phases of the input signal VIN and the output signal VOUT may be opposite or complementary to each other. For example, the input signal VIN and the output signal VOUT may be mutually inverted signals (e.g., inverses of each other).

For example, the first amplifier of the input stage 110 may include a first input transistor (e.g., a first N-type transistor MN1) and a second input transistor (e.g., a second N-type transistor MN2), which may have a common source configuration. The second amplifier may include a first P-type transistor MP1 and a second P-type transistor MP2, which may also have a common source configuration or structure.

For example, the input signal VIN may be provided to the gate of the first N-type transistor MN1, and the output signal VOUT may be provided to the gate of the second N-type transistor MN2. In an alternative embodiment, the output signal VOUT may not be fed back to or received by the gate of the second N-type transistor MN2.

The drains of the first and second N-type transistors MN1 and MN2 may be connected to the first or third node P1 or P3 of a first current mirror 122A (FIG. 3, described later), and the drains of the first and second P-type transistors MP1 and MP2 may be connected to the fifth or seventh node P5 or P7 of a second current mirror 124A (FIG. 3, described later).

For example, the first current I1 may be a current flowing between the drain of the N-type transistor MN2 and the first node P1, the second current I2 may be a current flowing between the drain of the N-type transistor MN1 and the third node P3, the third current I3 may be a current flowing between the drain of the P-type transistor MP2 and a fifth node P5, and the fourth current I4 may be a current flowing between the drain of the P-type transistor MP1 and the seventh node P7. The first bias circuit 140 may provide a bias current to the first amplifier (e.g., a first common source), and the second bias circuit 150 may provide a bias current to the second amplifier (e.g., a second common source).

For example, the first bias circuit 140 may control the amount of the bias current supplied to the common source (hereinafter, referred to as the "first common source") of the first and second P-type transistors MP1 and MP2 in response to a first bias voltage VB1.

For example, the first bias circuit 140 may include a first bias transistor MP3 including a gate to which the first bias voltage VB1 is input, and a source and a drain which are connected between a first power source and the first common source. The first bias transistor MP3 may be a P-type transistor, for example, a P-channel metal oxide semiconductor (PMOS) transistor.

The second bias circuit 150 may control the amount of the bias current supplied to the common source (hereinafter, referred to as the "second common source") of the first and second N-type transistors MN1 and MN2 in response to a second bias voltage VB2.

For example, the second bias circuit 150 may include a second bias transistor MN3 including a gate to which the second bias voltage VB2 is input, and a source and a drain which are connected between a second source and the second common source. For example, the second bias transistor MN3 may be an N-type transistor, for example, an N-channel metal oxide semiconductor (NMOS) transistor.

Referring to FIG. 3, the load stage 120 may include the first current mirror 122A, the second current mirror 124A, and a bias circuit 126.

For example, the first and second current mirrors 122A and 124A may be implemented as, but are not limited to, cascode current mirrors.

Further, the load stage 120 may include a first output node N1 outputting a first output voltage, a second output node N2 outputting a second output voltage, a third output node PG outputting a third output voltage VOP, and a fourth output node NG outputting a fourth output voltage VON.

For example, N1 may be the third node P3, N2 may be the seventh node P7, PG may be a fourth node P4, and NG may be an eighth node P8.

The first current mirror 122A may include first and second transistors MP4 and MP4_1 connected in series at the first node P1 receiving the first current I1, and third and fourth transistors MP5 and MP5_1 connected in series at the third node P3 receiving the second current I2.

For example, the first transistor MP4 may include a gate, and a source and a drain connected between the first power source and the first node P1. The second transistor MP4_1 may include a gate, and a source and a drain connected between the first node P1 and a second node P2. The second node P2 may be a node to which the source (or drain) of the second transistor MP4_1 and a third bias circuit 21 are connected.

The third transistor MP5 may include a gate connected to the gate of the first transistor MP4, and a source and a drain connected between the first power source and the third node P3. The fourth transistor MP5_1 may include a gate connected to the gate of the second transistor MP4_1, and a source and a drain connected between the third node P3 and the fourth node P4. The fourth node P4 may be a node to which the source (or drain) of the fourth transistor MP5_1 and a fourth bias circuit 22 of the bias circuit 126 are connected.

A third bias voltage VB5 may be provided to the gate of the second transistor MP4_1 and the gate of the fourth transistor MP5_1.

The gates of the first and third transistors MP4 and MP5 may be connected to each other and to the second node P2, and the gates of the second and fourth transistors MP4_1 and MP5_1 may be connected to each other.

The first current mirror 122A controls the third output voltage VOP on the third output node PG based on at least one of the first and second currents I1 and I2 and/or the third bias voltage VB5. The third output voltage VOP controls a first output transistor MP8 of the output stage 130.

The second current mirror 124A may include fifth and sixth transistors MN4 and MN4_1 connected in series at the fifth node P5 receiving the third current I3 and seventh and eighth transistors MN5 and MN5_1 connected in series at the seventh node P7 receiving the fourth current I4.

The fifth transistor MN4 may include a gate connected to a sixth node P6, and a source and a drain connected between the fifth node P5 and a second power source.

The sixth transistor MN4_1 may include a gate, and a source and a drain connected between the fifth node P5 and the sixth node P6.

The fifth node P5 may be a node to which the fifth transistor MN4 and the sixth transistor MN4_1 are connected, and the sixth node P6 may be a node to which the sixth transistor MN4_1 and the third bias circuit 21 are connected.

The seventh transistor MN5 may include a gate connected to the gate of the fifth transistor MN4, and a source and a drain connected between the seventh node P7 and the second power source.

The eighth transistor MN5_1 may include a gate connected to the gate of the sixth transistor MN4_1, and a source and a drain connected between the seventh node P7 and the eighth node P8. The eighth node P8 may be a node to which the eighth transistor MN5_1 and the fourth bias circuit 22 are connected to each other.

A fourth bias voltage VB6 may be provided to the gate of the sixth transistor MN4_1 and the gate of the eighth transistor MN5_1.

The gates of the fifth and seventh transistors MN4 and MN5 may be connected to each other and to the fifth node P6, and the gates of the sixth and eighth transistors MN4-1 and MN5_1 may be connected to each other.

The second current mirror 124A controls the fourth output voltage VON on the fourth output node NG in response to the fourth bias voltage VB6. The fourth output voltage VON controls a second output transistor MN8 of the output stage 130.

The bias circuit 126 may be connected between the first current mirror 122A and the second current mirror 124A. For example, the bias circuit 126 may include the third bias circuit 21 and the fourth bias circuit 22.

The third bias circuit 21 may be connected between the second transistor MP4_1 of the first current mirror 122A and the sixth transistor MN4_1 of the second current mirror 124A.

The fourth bias circuit 22 may be connected between the fourth transistor MP5_1 of the first current mirror 122A and the eighth transistor MN5_1 of the second current mirror 124A.

For example, the third bias circuit 21 may include, but is not limited to, a first terminal connected to the second node P2, a second terminal connected to the sixth node P6, a first control terminal controlled by a first control voltage VB3, and a second control terminal controlled by a second control voltage VB4.

Further, for example, the fourth bias circuit 22 may include, but is not limited to, a third terminal connected to the fourth node P4, a fourth terminal connected to the eighth node P8, a third control terminal controlled by the first control voltage VB3, and a fourth control terminal controlled by the second control voltage VB4.

For example, each of the third and fourth bias circuits 21 and 22 may include an N-type transistor and a P-type transistor that are connected in parallel.

For example, the first control voltage VB3 may be provided at the gate of the P-type transistor in each of the third and fourth bias circuits 21 and 22, and the second control voltage VB4 may be provided at the gate of the N-type transistor in each of the third and fourth bias circuits 21 and 22. For example, the first control voltage VB3 and the second control voltage VB4 may be, but are not limited to, mutually inverted (e.g., inverse or complementary) voltages.

The third node P3 and the seventh node P7 of the load stage 120 may be connected to or coupled to an output node NOUT of the output stage 130.

The fourth node P4 of the load stage 120 may be connected to the gate of the first output transistor MP8 of the output stage 130, and the eighth node P8 of the load stage 120 may be connected to the gate of the second output transistor MN8 of the output stage 130.

The output stage 130 may include an output driver that outputs the output voltage VOUT pulled up or pulled down between the first power source (e.g., the voltage VDD) and the second power source (e.g., the voltage VSS) based on the voltage VOP of the fourth node P4 and the voltage VON of the eighth node P8 of the load stage 120. The voltage VDD of the first power source may be greater than the voltage VSS of the second power source. For example, the voltage VSS of the second power source may be a ground voltage.

For example, the output driver of the output stage 130 may include the first output transistor MP8 and the second output transistor MN8. For example, the first output transistor MP8 may be a P-type transistor, and the second output transistor MN8 may be an N-type transistor.

The first output transistor MP8 may include a gate connected to the fourth node P4, and a source and a drain connected between the first power source and the output node NOUT.

The second output transistor MN8 may include a gate connected to the eighth node P8, and a source and a drain connected between the second power source and the output node NOUT.

The output node NOUT of the output stage 130 may be a node to which the first output transistor MP8 and the second output transistor MN8 are connected in series. For example, the output node NOUT may be a connection node between the drain of the first output transistor MP8 and the drain of the second output transistor MN8.

The load stage 120 may further include a first capacitor C1 connected between the third node P3 and the output node NOUT of the output stage 130. Further, the load stage 120 may further include a second capacitor C2 connected between the seventh node P7 and the output node NOUT of the output stage 130.

Referring to FIG. 4, the slew rate compensation circuit 102 may include a comparator 32, a first compensation current generator 34, and a second compensation current generator 36.

The comparator 32 compares the voltage of the input signal VIN with the voltage of the output signal VOUT, and generates a pull-up current or a pull-down current according to or as a result of the comparison. The pull-up current may be a current flowing between the first power source and the output node NOUT (VOUT) during a pull-up operation of the output stage 130, and the pull-down current may be a current flowing between the second power source and the output node NOUT (VOUT) during a pull-down operation of the output stage 130.

The comparator 32 may include a first transistor TN1 including a first drain, a first gate to which the input signal VIN is applied, and a first source to which the output signal VOUT is applied, and a second transistor TP1 including a second drain, a second gate to which the input signal VIN is applied, and a second source to which the output signal VOUT is applied.

For example, the first transistor TN1 may be an NMOS transistor, and the second transistor TP1 may be a PMOS transistor. Further, the first gate and the second gate may be connected in common (i.e., to each other at a common node), and the first source and the second source may be connected in common. In FIG. 4, the comparator 32 is implemented as, but is not limited to, a complementary metal oxide semiconductor (CMOS) inverter, but may be implemented as any of various types of comparison circuits.

The first compensation current generator 34 mirrors a first comparison current Id1 flowing between the first power source and the output node NOUT, and provides a mirroring current Im1 resulting from the mirroring to the fourth output node NG (or the gate of the second output transistor MN8).

The second compensation current generator 36 mirrors a second comparison current Id2 flowing between the output node NOUT and the second power source, and provides a mirroring current Im2 resulting from the mirroring to the third output node PG (or the gate of the first output transistor MP8).

For example, the first comparison current Id1 may be a pull-up current flowing between the first power source and the output node NOUT, when the first transistor TN1 is turned on and the second transistor TP1 is turned off. Further, for example, the comparison current Id2 may be a pull-down current flowing between the output node NOUT and the second power source, when the first transistor TN1 is turned off and the second transistor TP1 is turned on.

For example, each of the first and second compensation current generators 34 and 36 may be in the form of a current mirror of one or more stages. FIG. 4 illustrates a 2-stage current mirror, which should not be construed as limiting. Two stages may mean performing two current mirroring operations.

For example, the first compensation current generator 34 may include first to third PMOS transistors TP2, TP3, and TP4, and first and second NMOS transistors TN2 and TN3.

The first PMOS transistor TP2 may include a drain, a source connected to the first power source, and a gate configured to receive a bias voltage BIASP. The second PMOS transistor TP3 may include a source connected to the drain of the first PMOS transistor TP2, and a drain and a gate which are connected in common to the first transistor TN1 (e.g., the drain of the first transistor TN1) of the comparator 32. The third PMOS transistor TP4 may include a drain, a source connected to the first power source, and a gate connected to the gate of the second PMOS transistor TP3. For example, the bias voltage BIASP may be, but is not limited to, the voltage on the second node P2 of the load stage 120.

The first NMOS transistor TN2 may include a gate and a drain which are connected in common to the drain of the third PMOS transistor TP4, and a source connected to the second power source. The second NMOS transistor TN3 may include a gate connected to the gate of the first NMOS transistor TN2, a source connected to the second power source, and a drain that outputs the mirroring current Im1.

The drain of the second NMOS transistor TN3 may be connected to the eighth node P8 (or the gate of the second output transistor MN8), and the mirroring current Im1 may be provided to the eighth node P8 (or the gate of the second output transistor MN8).

For example, the second compensation current generator 36 may include third to fifth NMOS transistors TN4, TN5, and TN6, and fourth and fifth PMOS transistors TP5 and TP6.

The third NMOS transistor TN4 may include a drain, a source connected to the second power source, and a gate configured to receive the bias voltage BIASN. The fourth NMOS transistor TN5 may include a source connected to the drain of the third NMOS transistor TN4, and a drain and a gate which are connected in common to the second transistor TP1 (e.g., the drain of the second transistor TP1) in the comparator 32. The fifth NMOS transistor TN6 may include a drain, a source connected to the second power source, and a gate connected to the gate of the fourth NMOS transistor TN5. For example, the bias voltage BIASN may be, but is not limited to, the voltage on the fifth node P5 of the load stage 120.

The fourth PMOS transistor TP5 may include a gate and a drain which are connected in common to the drain of the fifth NMOS transistor TN6, and a source connected to the first power source. The fifth PMOS transistor TP6 may include a gate connected to the gate of the fourth PMOS transistor TP5, a source connected to the first power source, and a drain that outputs the mirroring current Im2. The drain of the fifth PMOS transistor TP6 may be connected to the fourth node P4 (or the gate of the first output transistor MP8), and the mirroring current Im2 may be provided to the fourth node P4 (or the gate of the first output transistor MP8).

The slew rate compensation circuit 102 operates as follows according to the embodiment illustrated in FIG. 4.

First, an operation of the slew rate compensation circuit 102 when the voltage of the input signal VIN is greater than the voltage of the output signal VOUT, and the difference between the two voltages VIN and VOUT is equal to or greater than a threshold voltage of a MOS transistor (e.g., an NMOS transistor such as TN1) of the comparator 32 (hereinafter referred to as a "first condition") will be described. For example, the first condition may be a case in which the voltage of the input signal VIN increases above the voltage of the output signal VOUT by the threshold voltage or greater.

Under the first condition, the magnitudes of the first and fourth currents I1 and I4 may decrease, the magnitudes of the second and third currents I2 and I3 may increase, the voltage on the first output node N1 may decrease, the voltage on the second node P2 may increase, the voltage on the second output node N2 may decrease, and the voltage on the sixth node P6 may increase.

Under the first condition, the first transistor TN1 is turned on and the second transistor TP1 is turned off in the comparator 32 in the slew rate compensation circuit 102, thereby activating the first compensation current generator 34 and causing the comparison current Id1 to flow through the first transistor TN1. The first compensation current generator 34 mirrors the comparison current Id1 and generates the mirroring current Im1. The generated mirroring current Im1 may become the compensation current IC2 and may be provided to the fourth output node NG. The voltage VON on the gate of the second output transistor MN8 in the output stage 130 may rapidly decrease due to the compensation current IC2. Accordingly, since a pull-down path of the output node NOUT may rapidly open, and the voltage on the gate of the first output transistor MP8 in the output stage 130 rapidly decreases through the fourth bias circuit 22 (e.g., MN7), the slew rate (e.g., rising slew rate) of the output voltage VOUT may increase.

Since the second transistor TP1 of the comparator 32 is turned off under the first condition, the second compensation current generator 36 is deactivated, and a compensation current is not provided from the second compensation current generator 36 to the third output node PG.

Next, an operation of the slew rate compensation circuit 102 when the voltage of the input signal VIN is smaller than the voltage of the output signal VOUT, and the difference between the two voltages VIN and VOUT is equal to or greater than the threshold voltage of the MOS transistor (e.g., a PMOS transistor such as TP1) in the comparator 32 (hereinafter referred to as a "second condition") will be described. For example, the second condition may be a case in which the voltage of the input signal VIN decreases below the voltage of the output signal VOUT by the threshold voltage or greater.

Under the second condition, the voltage on the first output node N1 may increase, the voltage on the second node P2 may decrease, the voltage on the second output node N2 may increase, and the voltage on the sixth node P6 may decrease.

Under the second condition, the first transistor TN1 is turned off and the second transistor TP1 is turned on, in the comparator 32 of the slew rate compensation circuit 102, thereby activating the second compensation current generator 36 and causing the comparison current Id2 to flow through the second transistor TP1. The second compensation current generator 36 mirrors the comparison current Id2 and generates the mirroring current Im2. The generated mirroring current Im2 may become the compensation current IC1 and may be provided to the third output node PG. The voltage VOP on the gate of the first output transistor MP8 in the output stage 130 may rapidly increase due to the compensation current IC1. Accordingly, since a pull-up path of the output node NOUT may be rapidly opened and the voltage on the gate of the second output transistor MN8 of the output stage 130 rapidly increases through the fourth bias circuit 22 (e.g., MP7), the slew rate (e.g., falling slew rate) of the output voltage VOUT may increase.

Since the first transistor TN1 of the comparator 32 is turned off under the second condition, the first compensation current generator 34 is deactivated, and no compensation current is provided from the first compensation current generator 34 to the fourth output node NG.

When the difference between the voltage of the input signal VIN and the voltage of the output signal VOT is less than the threshold voltage of the MOS transistor of the comparator 32, the slew rate compensation circuit 102 is deactivated. Therefore, there is no additional current consumption.

Figure 5:
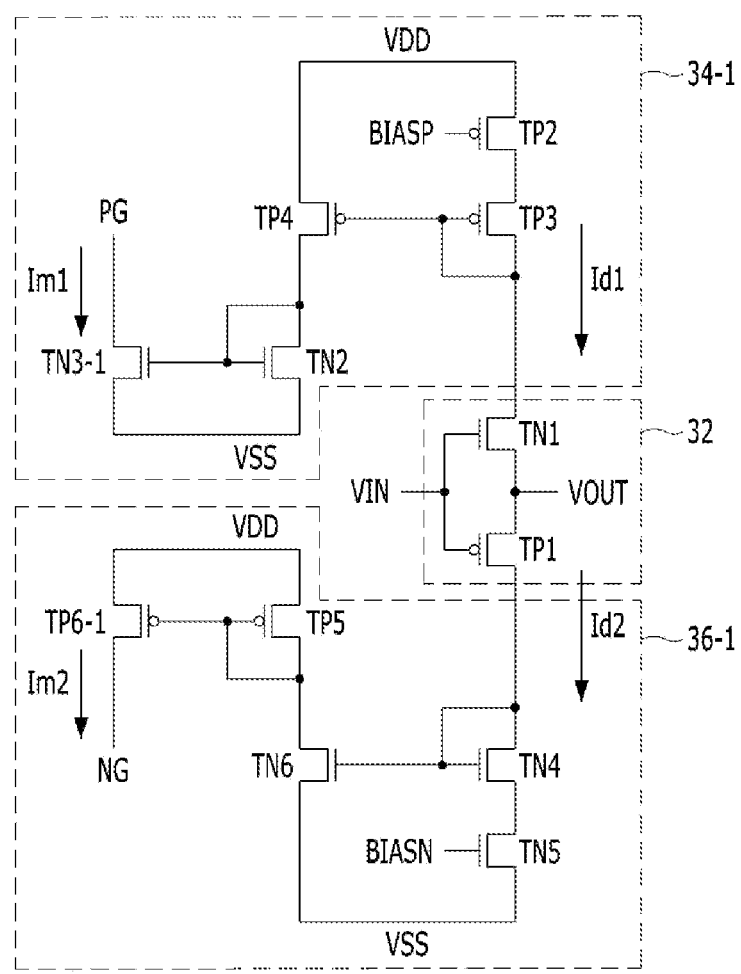
FIG. 5 is a diagram illustrating an exemplary slew rate compensation circuit according to another embodiment.

FIG. 5 is a diagram illustrating a slew rate compensation circuit 102-1 according to another embodiment. In FIG. 5, the same reference numerals as in FIG. 4 denote the same components, and the same components will either not be described again, or will be only briefly described to avoid unnecessary repetition.

Referring to FIG. 5, the slew rate compensation circuit 102-1, which is a modified example of the slew rate compensation circuit 102 illustrated in FIG. 4, may include the comparator 32, a first compensation current generator 34-1, and a second compensation current generator 36-1.

The mirroring current Im1 of the first compensation current generator 34-1 may be provided to the third output node PG (or the gate of the first output transistor MP8), rather than to the fourth output node NG (or the gate of the second output transistor MN8). For example, the drain of a second NMOS transistor TN3-1 of the first compensation current generator 34-1 may be connected to the gate of the third output node PG (or the first output transistor MP8).

The mirroring current Im2 of the second compensation current generator 36-1 may be provided to the fourth output node NG (or the gate of the second output transistor MN8), rather than to the third output node PG (or the gate of the first output transistor MP8). For example, the drain of a fifth PMOS transistor TP6-1 of the second compensation current generator 36-1 may be connected to the fourth output node NG (or the gate of the second output transistor MN8).

Under the first condition, the first compensation current generator 34-1 may generate the mirroring current Im1, and the generated mirroring current Im1 may become the compensation current IC1 and may be provided to the third output node PG (or the gate of the first output transistor MP8).

The voltage on the gate of the first output transistor MP8 in the output stage 130 may rapidly decrease by the compensation current IC1, thereby increasing the slew rate (e.g., rising slew rate) of the output voltage VOUT.

Under the second condition, the second compensation current generator 36-1 may generate the mirroring current Im1, and the generated mirroring current Im1 may become the compensation current IC2 and provided to the fourth output node NG (or the gate of the second output transistor MN8).

The voltage on the gate of the second output transistor MN8 in the output stage 130 may rapidly increase due to the compensation current IC2, thereby increasing the slew rate (e.g., falling slew rate) of the output voltage VOUT.

Figure 6:
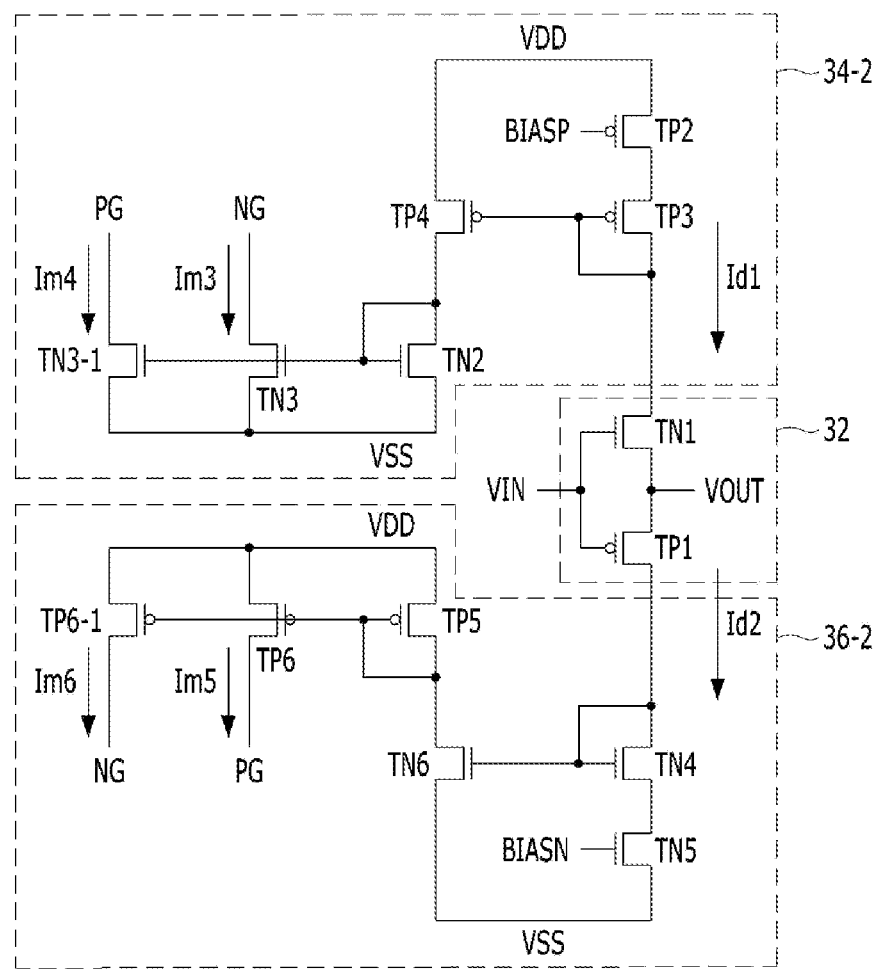
FIG. 6 is a diagram illustrating an exemplary slew rate compensation circuit according to another embodiment.

FIG. 6 is diagram illustrating a slew rate compensation circuit 102-2 according to another embodiment. In FIG. 6, the same reference numerals as in FIGS. 4 and 5 denote the same components, and the same components will either not be described again, or will be only briefly described to avoid unnecessary repetition.

The slew rate compensation circuit 102-2, which is a modified example with the embodiments of FIGS. 4 and 5 combined, may include the comparator 32, a first compensation current generator 34-2, and a second compensation current generator 36-2. The first compensation current generator 34-2 may include both the second NMOS transistor TN3 of FIG. 4 and the second NMOS transistor TN3-1 of FIG. 5. In addition, the second compensation current generator 36-2 may include both the fifth PMOS transistor TP6 of FIG. 4 and the fifth PMOS transistor TP6-1 of FIG. 5.

Under the first condition, the first compensation current generator 34-2 may generate a third mirroring current Im3 and a fourth mirroring current Im4 by mirroring the first comparison current Id1. The third mirroring current Im3 and the fourth mirroring current Im4 may correspond to the first compensation current Id1.

For example, the third mirroring current Im3 and the fourth mirroring current Im4 may be, but are not necessarily, identical, and may be different depending on the magnification of the mirroring operation at each of the NMOS transistors TN3 and TN3-1.

Under the first condition, the first compensation current generator 34-2 may provide the third mirroring current Im3 to the fourth output node NG and the fourth mirroring current Im4 to the third output node PG.

Since the drain of the second NMOS transistor TN3 is connected to the gate of the second output transistor MN8, the voltage VON on the gate of the second output transistor MN8 may rapidly decrease by the third mirroring current Im3, and the pull-down path of the output stage 130 may be opened. Further, since the drain of the second NMOS transistor TN3-1 is connected to the gate of the first output transistor MP8, the gate voltage VOP of the first output transistor MP8 may rapidly decrease by the fourth mirroring current Im4, thereby increasing the slew rate of the output voltage VOUT.

Under the second condition, the second compensation current generator 36-2 may generate a fifth mirroring current Im5 and a sixth mirroring current Im6 by mirroring the second comparison current Id2. The fifth mirroring current Im5 and the sixth mirroring current Im6 may correspond to the second compensation current IC2. For example, the fifth mirroring current Im5 and the sixth mirroring current Im6 may be, but are not necessarily, identical, and may be different depending on the magnification of the mirroring operation at each of the PMOS transistors TP6 and TP6-1.

Under the second condition, the second compensation current generator 36-2 may provide the fifth mirroring current Im5 to the third output node PG (or the gate of the first output transistor MP8) and the sixth mirroring current Im6 to the fourth output node NG (the gate of the second output transistor MN8).

Since the drain of the fifth PMOS transistor TP6 is connected to the gate of the first output transistor MP8, the voltage on the gate of the first output transistor MP8 may rapidly increase due to the fifth mirroring current Im5, and the pull-up path of the output stage 130 may be opened. Further, since the drain of the fifth PMOS transistor TP6-1 is connected to the gate of the second output transistor MN8, the voltage on the gate of the second output transistor MN8 may rapidly increase due to the sixth mirroring current Im6, thereby increasing the slew rate of the output voltage VOU.

Figure 7:
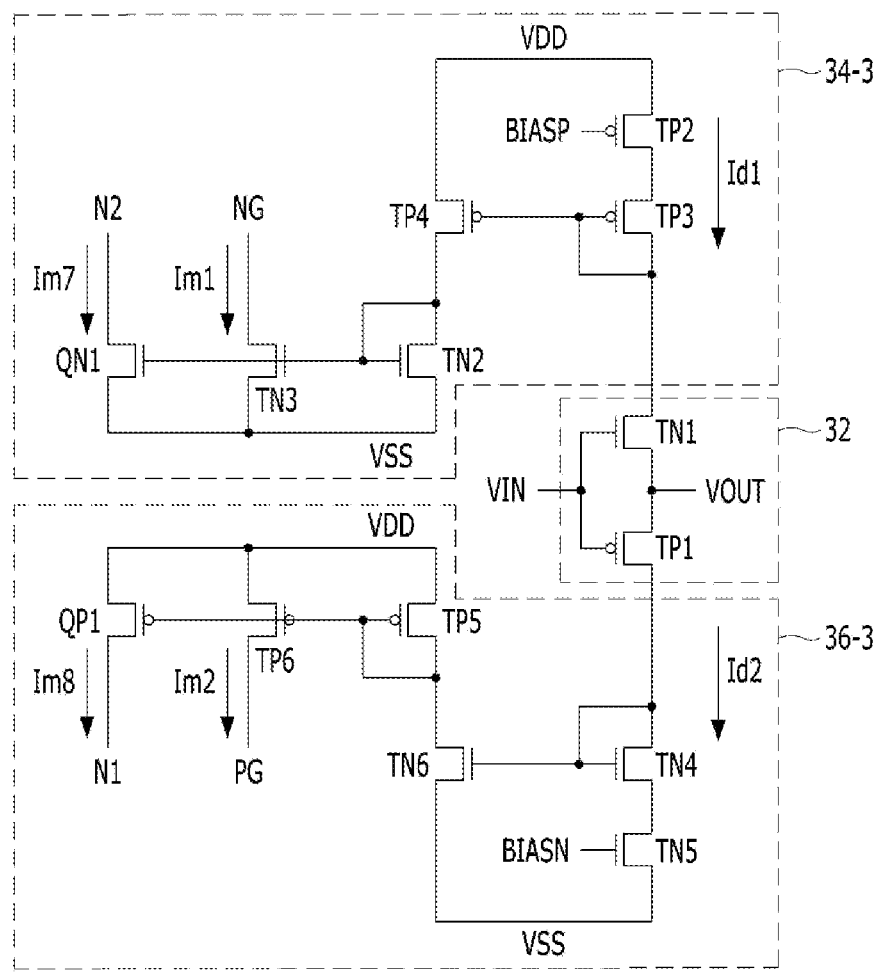
FIG. 7 is a diagram illustrating an exemplary slew rate compensation circuit according to another embodiment.

FIG. 7 is a diagram illustrating a slew rate compensation circuit 102-3 according to another embodiment. In FIG. 7, the same reference numerals as in FIG. 4 denote the same components, and the same components will either not be described again, or will be only briefly described to avoid unnecessary repetition.

Referring to FIG. 7, the slew rate compensation circuit 102-3, which is a modified example of the slew rate compensation circuit 102, may include the comparator 32, a first compensation current generator 34-3, and a second compensation current generator 36-3.

Compared to FIG. 4, the first compensation current generator 34-3 may further include a transistor QN1, and the second compensation current generator 36-4 may further include a transistor QP1. QN1 may be an NMOS transistor, and QP1 may be a PMOS transistor.

For example, the transistor QN1 may include a gate connected to the gate of the first NMOS transistor TN2, a source connected to the second power source, and a drain outputting a seventh mirroring current Im7. The drain of the transistor QN1 may be connected to the second output node N2.

For example, the transistor QP1 may include a gate connected to the gate of the fourth PMOS transistor TP5, a source connected to the first power source, and a drain outputting an eighth mirroring current Im8. The drain of the transistor QP1 may be connected to the first output node N1.

Under the first condition, the first compensation current generator 34-3 may generate the first mirroring current Im1 and a seventh mirroring current Im7 by mirroring the first comparison current Id1. For example, the first mirroring current Im1 and the seventh mirroring current Im7 may be, but are not necessarily, identical, and may be different depending on the magnification of the mirroring operation at each of the NMOS transistors TN3 and QN1. The second compensation current generator 36-3 may be deactivated under the first condition.

Under the first condition, the first compensation current generator 34-3 may provide the first mirroring current Im1 to the fourth output node NG (or the gate of the second output transistor MN8) and the seventh mirroring current Im7 to the second output node N2, and the slew rate (e.g., rising slew rate) of the output voltage VOUT may increase due to the first mirroring current Im1 and the seventh mirroring current Im7.

Under the second condition, the second compensation current generator 36-3 may generate the second mirroring current Im2 and the eighth mirroring current Im8 by mirroring the second comparison current Id2. For example, the second mirroring current Im2 and the eighth mirroring current Im8 may be, but are not necessarily, identical, and may be different depending on the magnification of the mirroring operation at each of the PMOS transistors TP6 and QP1. The first compensation current generator 34-3 may be deactivated under the second condition.

Under the second condition, the second compensation current generator 36-3 may provide the second mirroring current Im2 to the third output node PG (the gate of the first output transistor MP8) and the eighth mirroring current Im8 to the first output node N1, and the slew rate (e.g., falling slew rate) of the output voltage VOUT may increase due to the second mirroring current Im2 and the eighth mirroring current Im8.

Figure 8:
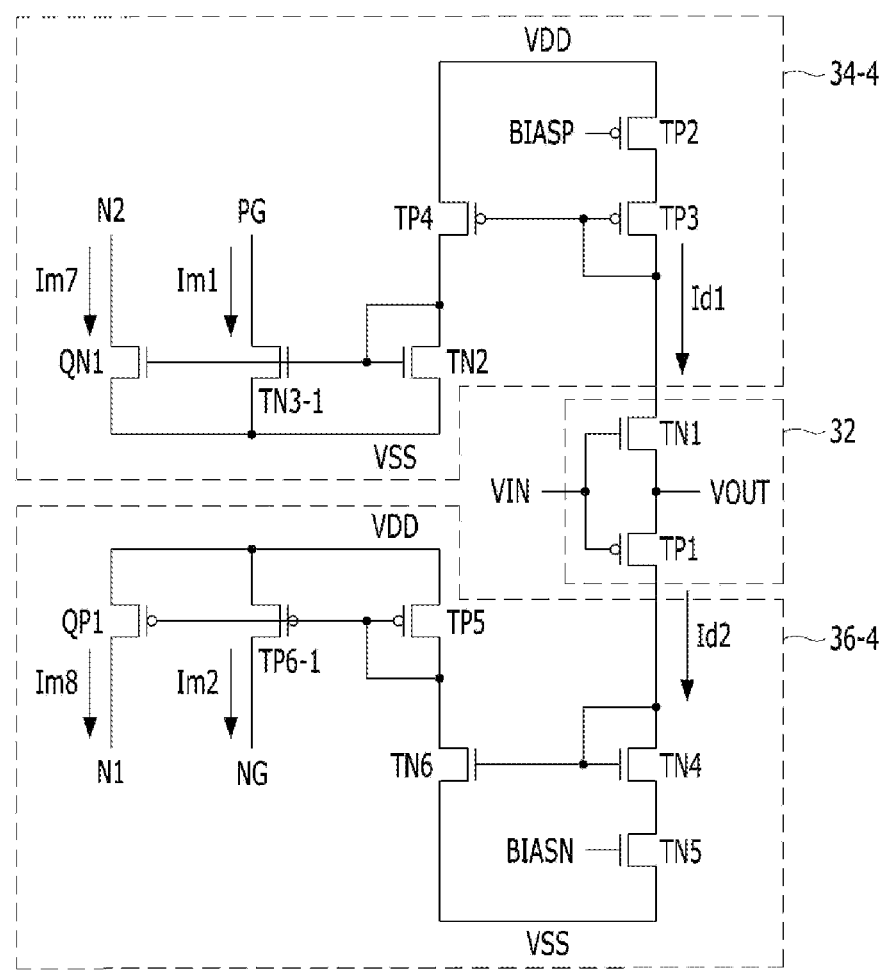
FIG. 8 is a diagram illustrating an exemplary slew rate compensation circuit according to another embodiment.

FIG. 8 is a diagram illustrating a slew rate compensation circuit 102-4 according to another embodiment. In FIG. 8, the same reference numerals as in FIG. 5 denote the same components, and the same components will either not be described again, or will be only briefly described to avoid unnecessary repetition.

Referring to FIG. 8, the slew rate compensation circuit 102-4, which is a modified example of the slew rate compensation circuit 102-1 illustrated in FIG. 5 and/or the slew rate compensation circuit 102-3 illustrated in FIG. 7, may include the comparator 32, a first compensation current generator 34-4, and a second compensation current generator 36-4.

Compared to FIG. 7, the first compensation current generator 34-4 may include the second NMOS transistor TN3-1 of FIG. 5 instead of the second NMOS transistor TN3 of FIG. 7. Further, the second compensation current generator 36-4 may include the fifth PMOS transistors TP6-1 of FIG. 5 instead of the fifth PMOS transistors TP6 of FIG. 7.

Under the first condition, the first compensation current generator 34-4 may provide the first mirroring current Im1 to the third output node PG (the gate of the first output transistor MP8) and the seventh mirroring current Im7 to the second output node N2, and the slew rate (e.g., rising slew rate) of the output voltage VOUT may increase due to the first mirroring current Im1 and the seventh mirroring current Im7.

Under the second condition, the second compensation current generator 36-4 may provide the second mirroring current Im2 to the fourth output node NG (the gate of the second output transistor NM8) and the eighth mirroring current Im8 to the first output node N1, and the slew rate (e.g., falling slew rate) of the output voltage VOUT may increase due to the first mirroring current Im1 and the eighth mirroring current Im8.

Figure 9:
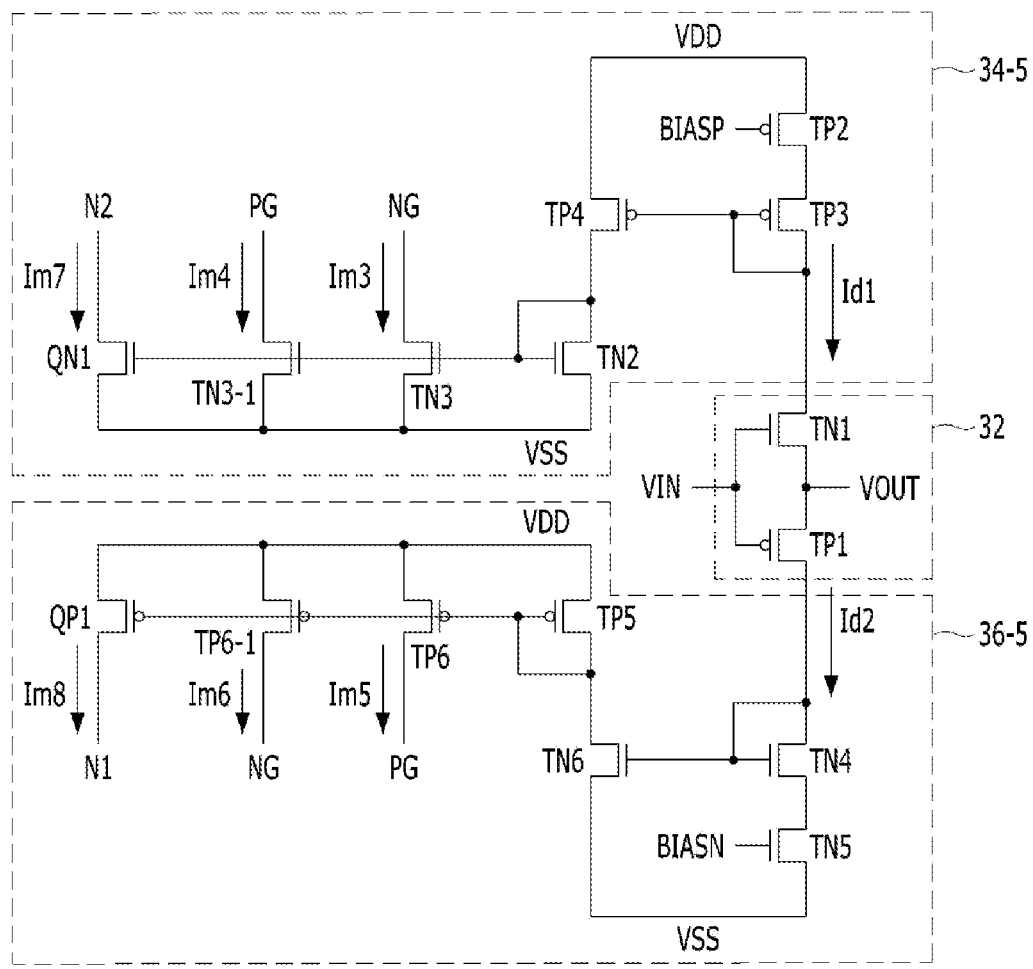
FIG. 9 is a diagram illustrating an exemplary slew rate compensation circuit according to another embodiment.

FIG. 9 is a diagram illustrating a slew rate compensation circuit 102-5 according to another embodiment. In FIG. 9, the same reference numerals as in FIGS. 7 and 8 denote the same components, and the same components will either not be described again, or will be only briefly described to avoid unnecessary repetition.

Referring to FIG. 9, the slew rate compensation circuit 102-5, which is a modified embodiment of the slew rate compensation circuit 102-1 illustrated in FIG. 5 and/or the slew rate compensation circuit 102-2 in FIG. 6, may include the comparator 32, a first compensation current generator 34-5, and a second compensation current generator 36-5.

Compared to the embodiment of FIG. 6, the first compensation current generator 34-5 of FIG. 9 may further include the NMOS transistor QN1 of FIG. 7, and the second compensation current generator 36-5 of FIG. 9 may further include the PMOS transistor QP1 of FIG. 7. The descriptions of FIGS. 6 to 8 may be applied to the embodiment of FIG. 9.

Under the first condition, the first compensation current generator 34-5 may generate the third mirroring current Im3, the fourth mirroring current Im4, and the seventh mirroring current Im7 by mirroring the first comparison current Id1. The third mirroring current Im3 may be provided to the fourth output node NG, the fourth mirroring current Im4 may be provided to the third output node PG, and the seventh mirroring current Im7 may be provided to the second node N2. Under the first condition, the slew rate (e.g., rising slew rate) of the output voltage VOUT may increase due to the third mirroring current Im3, the fourth mirroring current Im4, and the seventh mirroring current Im7.

Under the second condition, the second compensation current generator 36-5 may generate the fifth mirroring current Im5, the sixth mirroring current Im6, and the eighth mirroring current Im8 by mirroring the second comparison current Id2. The fifth mirroring current Im5 may be provided to the third output node PG, the sixth mirroring current Im6 may be provided to the third output node NG, and the eighth mirroring current Im8 may be provided to the first node N1. Under the second condition, the slew rate (e.g., falling slew rate) of the output voltage VOUT may increase due to the fifth mirroring current Im5, the sixth mirroring current Im6, and the eighth mirroring current Im8.

Figure 10:
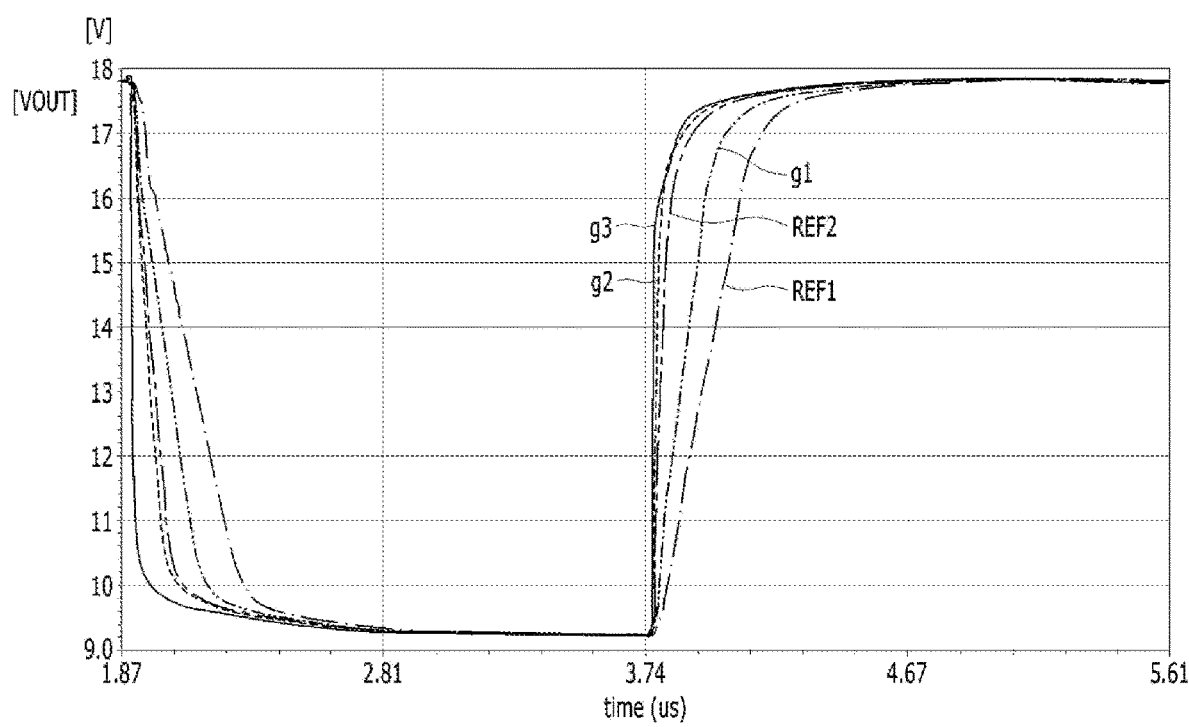
FIG. 10 is a graph illustrating exemplary output voltage waveforms according to various embodiments of the disclosure.

FIG. 10 illustrates waveforms of the output voltage VOUT according to various embodiments.

REF1 represents the waveform of the output voltage of an output buffer (e.g., the output buffer 101 in FIG. 1) when the slew rate compensation circuit is not present, and REF2 represents the waveform of the output voltage in an otherwise identical example in which the first compensation current Im1 from the slew rate compensation circuit 102 illustrated in FIG. 4 is provided to the first node N1, and the second compensation current Im2 from the slew rate compensation circuit 102 illustrated in FIG. 4 is provided to the second output node N2.

g1 represents the waveform of the output voltage VOUT in the embodiment of FIG. 4, g2 represents the waveform of the output voltage VOUT in the embodiment of FIG. 7, and g3 represents the waveform of the output voltage VOUT in the embodiment of FIG. 8.

Referring to FIG. 10, the slew rate of the output voltage in each of the embodiments including the slew rate compensation circuits 102, 102-3, and 102-4 is higher than the slew rate of the output voltage of REF1.

Further, compared to the embodiment of FIG. 4, an additional compensation current (e.g., Im7) is provided to the second output node N2 of the load stage 120 during the pull-up operation, and an additional compensation current (e.g., Im8) is provided to the first output node N1 of the load stage 120 during the pull-down operation, thereby increasing the slew rate of the output voltage VOUT in the embodiment of FIG. 7.

Further, compared to the embodiment of FIG. 5, an additional compensation current (e.g., Im7 or Im8) is provided during the pull-up or pull-down operation in the embodiment of FIG. 8. Therefore, the slew rate of the output voltage VOUT may be increased even further.

Compared to REF2, an additional compensation current (e.g., Im1) is provided to the fourth output node NG (or the third output node PG) of the load stage 120 during the pull-up operation, and an additional compensation current (e.g., Im2) is provided to the third output node PG (or the fourth output node NG) during the pull-down operation, in the embodiments of FIGS. 7 and 8. Therefore, the slew rate of the output voltage VOUT may be increased by the embodiments of FIGS. 7 and 8 relative to the example of REF2.

In various embodiments, the comparison currents Id1 and Id2 based on a comparison between the input signal VIN and the output signal VOUT may be mirrored, and the voltages VOP and VON on the gates of the transistors MP8 and MN8 (which are the pull-up and pull-down drivers in the output stage 130) may be directly controlled by the mirrored comparison currents as compensation currents. Therefore, the output signal VOUT may have a relatively high slew rate.

Further, since the output buffer according to various embodiments may increase the slew rate of the output voltage and/or signal without excessive additional circuit elements, it may be implemented in a relatively small area.

Figure 11:
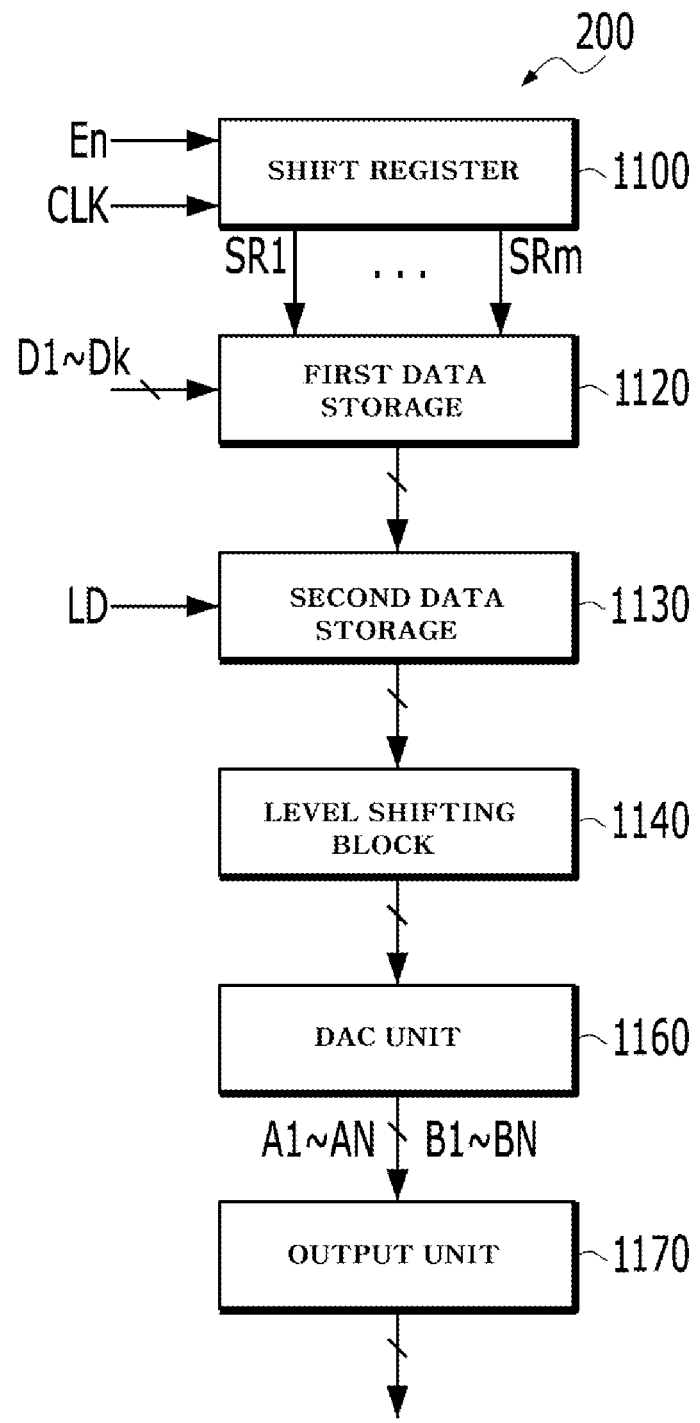
FIG. 11 is a block diagram illustrating an exemplary source driver according to an embodiment of the disclosure.

FIG. 11 is a block diagram illustrating a source driver 200 according to one or more embodiments of the disclosure.

Referring to FIG. 11, the source driver 200 includes a shift register 1110, a first data storage block 1120, a second data storage block 1130, a level shifting block 1140, a digital-to-analog converter (DAC) unit 1160, and an output unit 1170.

The shift register 1110 generates shift signals SR1 to SRm (where m is an integer >1) in response to an enable signal En and a clock signal CLK in order to control the timing at which data (for example, digital image data) are stored (e.g., sequentially) in the first data storage block 1120 (e.g., in a first latch in the first data storage block 1120).

For example, the shift register 1110 may generate the shift signals SR1 to SRm after or in response to receiving a horizontal start signal from a timing controller (not shown) and shifting the received horizontal start signal in response to the clock signal CLK. Alternatively, the shift register 1110 may generate the shift signals in response to a start pulse, instead of the horizontal start signal.

The first data storage 1120 stores data Dl to Dn (where n is a natural number greater than 1), which may be received from the timing controller (not shown), in response to the shift signals SR1 to SRm (where m is a natural number greater than 1) from the shift register 210.

The first data storage unit 1120 may include a plurality of first latches (not shown), and the plurality of first latches may store the data Dl to Dn (where n is a natural number greater than 1).

For example, the data may comprise red (R), green (G), and blue (B) color or image data, and the first latches of the first data storage unit 1120 may store the R, G, B data.

Figure 12:
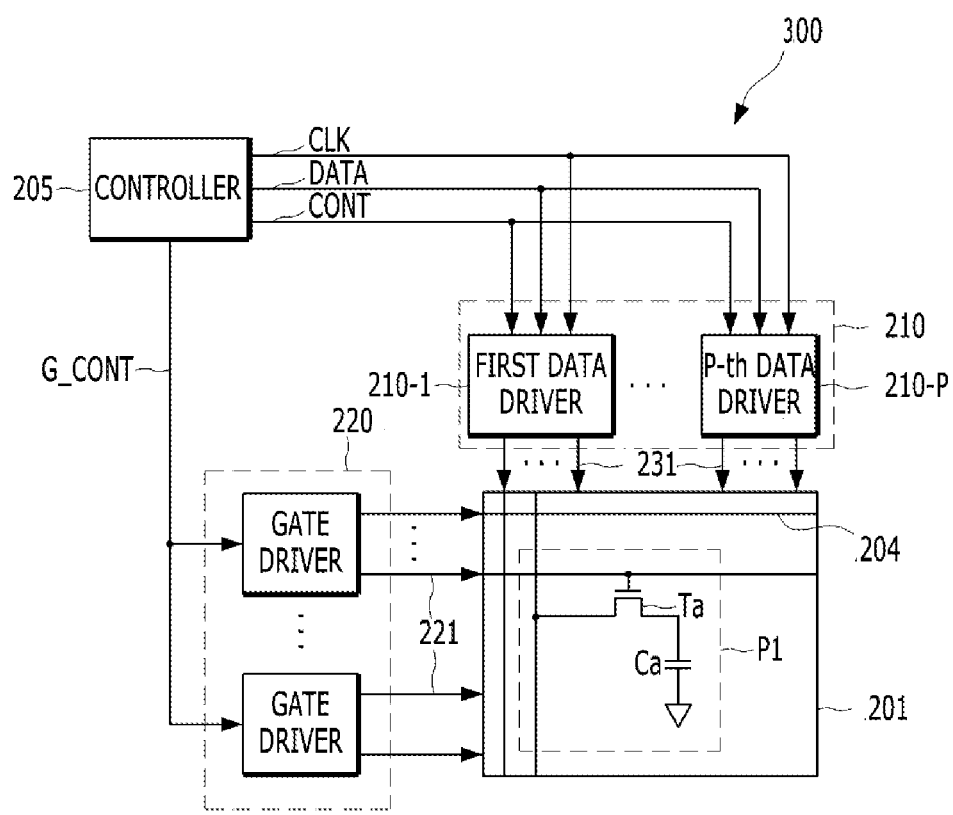
FIG. 12 is a block diagram illustrating an exemplary display device including a source driver according to an embodiment of the disclosure.

For example, the data Dl to Dn (where n is a natural number greater than 1), which may be received from the timing controller 205 in FIG. 12 in response to the shift signals SR1 to SRm (where m is a natural number greater than 1), may be sequentially stored in the first latches in the first data storage 1120.

Referring back to FIG. 11, the second data storage 1130 stores data output from the first data storage 1120 in response to a control signal LD, which may also be received from the timing controller 205.

For example, the second data storage 1130 may store the data output from the first data storage unit 1120 in units of a horizontal line period.

For example, the horizontal line period may be a time period to completely store data corresponding to one horizontal line 204 of the display panel 201 (FIG. 12) in all of the first latches of the first data storage 1120. For example, the horizontal line period may mean one cycle of the horizontal line signal.

The second data storage unit 1130 in FIG. 11 may include a plurality of second latches, and the number of second latches may be equal to the number of first latches.

The level shifting block 1140 converts the voltage level of the data received from the second data storage 1130. For example, the level shifting block 1140 may convert a first voltage or a first voltage level of the data received from the second data storage 1130 to a second voltage or a second voltage level.

For example, the level shifting block 1140 may include a plurality of level shifters, and the number of the level shifters may be equal to the number of first latches or/and the number of second latches, which should not be construed as limiting.

The DAC unit 1160 converts the output of the level shifting block 1140 (that is, digital data having the second voltage or voltage level) into an analog signal. For example, the DAC unit 1160 may include a plurality of DACs corresponding to the plurality of level shifters.

The output unit 1170 amplifies and/or buffers the analog signal received from the DAC unit 1160 and outputs the amplified and/or buffered analog signal.

The output unit 1170 may include a plurality of output buffers configured to buffer the analog signals received from the plurality of DACs and/or a plurality of amplifiers configured to amplify the analog signals received from the plurality of DACs.

The output unit 1170 may include a plurality of the output buffers 100 according to the above-described embodiments.

For example, the output unit 1170 may include a plurality of output buffers 100, and the plurality of output buffers 100 may amplify analog signals output from the DAC unit 1160 and provide the amplified analog signals to a corresponding one of the data lines 231 (FIG. 12). For example, each of the plurality of output buffers may be or comprise the output buffer 100 according to the embodiment(s) of FIG. 1.

FIG. 12 illustrates a display device 300 including the source driver 200 according to one or more embodiments of the disclosure.

Referring to FIG. 12, the display device 300 includes a display panel 201, a controller 205 (or a "timing controller"), a data driver unit 210, and a gate driver unit 220.

The display panel 201 may be in the form of a matrix in which gate lines 221 forming rows and data lines 231 forming columns intersect each other, and may include pixels (e.g., P1) each connected to one of the gate lines and one of the data lines intersecting the gate lines. There may be a plurality of pixels P1, and each pixel P1 may include a transistor Ta and a capacitor Ca.

The controller 205 outputs a clock signal CLK, data DATA, a data control signal CONT for controlling the data driver unit 210, and a gate control signal G_CONT for controlling the gate driver unit 220.

For example, the data control signal CONT may include a horizontal start signal or start pulse, a control signal LD, an enable signal En, and a clock signal CLK, some of which are input to the shift register 1110 of the data driver IC.

The gate driver unit 220 may drive the gate lines 221, include a plurality of gate drivers, and output gate control signals for controlling the transistors Ta of the pixels connected to the gate lines.

The data driver unit 210 drives the data lines 231 and may include a plurality of data drivers 210-1 to 210-P (where P is a natural number greater than 1). For example, each of the data drivers may be or comprise the source driver 100 according to one or more embodiments.

As is apparent from the above description, various embodiments of the disclosure may increase the slew rate of an output signal or an output signal voltage without increasing current consumption.

The embodiments as described above may include particular features, structures, or characteristics, but not every embodiment necessarily includes the particular features, structures, or characteristics (e.g., of other embodiments). Furthermore, the particular features, structures or characteristics in each embodiment may be combined in any suitable manner, as would be apparent to one of ordinary skill in the art from this disclosure, in one or more other embodiments. Therefore, combinations of features of different embodiments are meant to be within the scope of the invention.

What is claimed is:

1. An output buffer comprising:
   an input stage including a first amplifier generating first and second currents by differentially amplifying a first input signal and a second input signal, and a second amplifier generating third and fourth currents by differentially amplifying the first input signal and the second input signal;
   a first current mirror including first and second transistors connected in series at a first node configured to receive or provide the first current and connected between a first power source and a second node, and third and fourth transistors connected in series at a third node configured to receive or provide the second current and connected between the first power source and a fourth node;
   a second current mirror including fifth and sixth transistors connected in series at a fifth node configured to receive or provide the third current and connected between a second power source and a sixth node, and seventh and eighth transistors connected in series at a seventh node configured to receive or provide the fourth current and connected between the second power source and an eighth node;
   an output stage including a first output transistor including a gate connected to the fourth node and connected between the first power source and an output node, and a second output transistor including a gate connected to the eighth node and connected between the second power source and the output node; and
   a slew rate compensation circuit configured to mirror a comparison current generated by comparing a voltage of the first input signal with a voltage of the second input signal, and provide a first mirrored comparison current to at least one of the fourth node or the eighth node,
   wherein the slew rate compensation circuit is configured to generate a first comparison current between the first power source and the output node, generate a first mirroring current and a second mirroring current resulting from mirroring the first comparison current, provide the first mirroring current to the eighth node, and provide the second mirroring current to the seventh node.

2. The output buffer according to claim 1, further comprising a first capacitor connected between the third node and the output node, and a second capacitor connected between the seventh node and the output node.

3. The output buffer according to claim 1, wherein the slew rate compensation circuit is configured to generate a first comparison current between the first power source and the output node, and provide a mirroring current resulting from mirroring the first comparison current to the eighth node.

4. The output buffer according to claim 3, wherein the slew rate compensation circuit is configured to generate a second comparison current between the output node and the second power source, and provide a mirroring current resulting from mirroring the second comparison current to the fourth node.

5. The output buffer according to claim 1, wherein the slew rate compensation circuit is configured to generate a first comparison current between the first power source and the output node, and provide a mirroring current resulting from mirroring the first comparison current to the fourth node.

6. The output buffer according to claim 5, wherein the slew rate compensation circuit is configured to generate a second comparison current between the output node and the second power source, and provide a mirroring current resulting from mirroring the second comparison current to the eighth node.

7. The output buffer according to claim 1, wherein a first voltage of the first power source is greater than a second voltage of the second power source.

8. The output buffer according to claim 1, wherein the slew rate compensation circuit is configured to generate a first comparison current between the first power source and the output node, generate a first mirroring current and a second mirroring current resulting from mirroring the first comparison current, provide the first mirroring current to the fourth node, and provide the second mirroring current to the eighth node.

9. The output buffer according to claim 8, wherein the slew rate compensation circuit is configured to generate a second comparison current between the output node and the second power source, generate a third mirroring current and a fourth mirroring current resulting from mirroring the second comparison current, provide the third mirroring current to the fourth node, and provide the fourth mirroring current to the eighth node.

10. The output buffer according to claim 1, wherein the slew rate compensation circuit is configured to generate a second comparison current between the output node and the second power source, generate a third mirroring current and a fourth mirroring current resulting from mirroring the second comparison current, provide the third mirroring current to the fourth node, and provide the fourth mirroring current to the third node.

11. The output buffer according to claim 1, further comprising:
    a third bias circuit connected between the second node and the fifth node and controlled by a first control voltage; and
    a fourth bias circuit connected between the fourth node and the seventh node and controlled by a second control voltage.

12. The output buffer according to claim 1, wherein the first input signal comprises a voltage fed back from the output node.

13. The output buffer according to claim 12, wherein the slew rate compensation circuit comprises:
    a comparator configured to generate a first comparison current between the first power source and the output node or a second comparison current between the output node and the second power source from a comparison of the voltage of the first input signal with the voltage of the second input signal;
    a third current mirror configured to mirror the first comparison current and generate the first mirrored comparison current; and
    a fourth current mirror configured to mirror the second comparison current and generate a second mirrored comparison current.

14. A source driver comprising:
a latch configured to store data;
a level shifter configured to convert a voltage level of the data from the latch;
a digital-to-analog converter configured to convert an output of the level shifter to an analog signal; and
an output buffer configured to amplify the analog signal and output the amplified analog signal,
wherein the output buffer includes the output buffer according to claim 1.

15. An output buffer comprising:
an input stage including a first amplifier generating first and second currents by differentially amplifying a first input signal and a second input signal, and a second amplifier generating third and fourth currents by differentially amplifying the first input signal and the second input signal;
a first current mirror including first and second transistors connected in series at a first node configured to receive or provide the first current and connected between a first power source and a second node, and third and fourth transistors connected in series at a third node configured to receive or provide the second current and connected between the first power source and a fourth node;
a second current mirror including fifth and sixth transistors connected in series at a fifth node configured to receive or provide the third current and connected between a second power source and a sixth node, and seventh and eighth transistors connected in series at a seventh node configured to receive or provide the fourth current and connected between the first power source and an eighth node;
an output stage including a first output transistor including a gate connected to the fourth node and connected between the first power source and an output node, and a second output transistor including a gate connected to the eighth node and connected between the second power source and the output node; and
a slew rate compensation circuit configured to mirror a comparison current generated by comparing a voltage of the first input signal with a voltage of the second input signal, and provide a first mirrored comparison current to at least one of the fourth node or the eighth node,
wherein the slew rate compensation circuit is configured to generate a first comparison current between the first power source and the output node, generate a first mirroring current and a second mirroring current resulting from mirroring the first comparison current, provide the first mirroring current to the fourth node, and provide the second mirroring current to the seventh node.

16. The output buffer according to claim 15, wherein the slew rate compensation circuit is configured to generate a first comparison current between the first power source and the output node, generate a first mirroring current and a second mirroring current resulting from mirroring the first comparison current, provide the first mirroring current to the eighth node, and provide the second mirroring current to the seventh node.

17. The output buffer according to claim 15, wherein the slew rate compensation circuit is configured to generate a second comparison current between the output node and the second power source, generate a third mirroring current and a fourth mirroring current resulting from mirroring the second comparison current, provide the third mirroring current to the eighth node, and provide the fourth mirroring current to the third node.

18. An output buffer comprising:
an input stage including a first amplifier generating first and second currents by differentially amplifying a first input signal and a second input signal, and a second amplifier generating third and fourth currents by differentially amplifying the first input signal and the second input signal;
a first current mirror including first and second transistors connected in series at a first node configured to receive or provide the first current and connected between a first power source and a second node, and third and fourth transistors connected in series at a third node configured to receive or provide the second current and connected between the first power source and a fourth node;
a second current mirror including fifth and sixth transistors connected in series at a fifth node configured to receive or provide the third current and connected between a second power source and a sixth node, and seventh and eighth transistors connected in series at a seventh node configured to receive or provide the fourth current and connected between the first power source and an eighth node;
an output stage including a first output transistor including a gate connected to the fourth node and connected between the first power source and an output node, and a second output transistor including a gate connected to the eighth node and connected between the second power source and the output node; and
a slew rate compensation circuit configured to mirror a comparison current generated by comparing a voltage of the first input signal with a voltage of the second input signal, and provide a first mirrored comparison current to at least one of the fourth node or the eighth node,
wherein the slew rate compensation circuit is configured to generate a first comparison current between the first power source and the output node, generate a first mirroring current, a second mirroring current, and a third mirroring current resulting from mirroring the first comparison current, provide the first mirroring current to the eighth node, provide the second mirroring current to the fourth node, and provide the third mirroring current to the seventh node.

19. The output buffer according to claim 18, wherein the slew rate compensation circuit is configured to generate a first comparison current between the first power source and the output node, generate a first mirroring current and a second mirroring current resulting from mirroring the first comparison current, provide the first mirroring current to the fourth node, and provide the second mirroring current to the seventh node.

20. The output buffer according to claim 18, wherein the slew rate compensation circuit is configured to generate a second comparison current between the output node and the second power source, generate a fourth mirroring current, a fifth mirroring current, and a sixth mirroring current resulting from mirroring the second comparison current, provide the fourth mirroring current to the fourth node, provide the fifth mirroring current to the eighth node, and provide the sixth mirroring current to the third node.

* * * * *